United States Patent
Chaji (10) Patent No.: US 12,051,612 B2
(45) Date of Patent: Jul. 30, 2024

(54) HIGH THROUGHPUT MICROPRINTING PROCESS

(71) Applicant: VueReal Inc., Waterloo (CA)

(72) Inventor: Gholamreza Chaji, Kitchener (CA)

(73) Assignee: VueReal Inc., Waterloo (CA)

( * ) Notice: Subject to any disclaimer, the term of this patent is extended or adjusted under 35 U.S.C. 154(b) by 414 days.

(21) Appl. No.: 17/617,159

(22) PCT Filed: Jun. 18, 2020

(86) PCT No.: PCT/CA2020/050840
§ 371 (c)(1),
(2) Date: Dec. 7, 2021

(87) PCT Pub. No.: WO2020/252577
PCT Pub. Date: Dec. 24, 2020

(65) Prior Publication Data
US 2022/0270908 A1     Aug. 25, 2022

Related U.S. Application Data

(60) Provisional application No. 62/863,050, filed on Jun. 18, 2019.

(51) Int. Cl.
*H01L 21/683* (2006.01)
*H01L 25/075* (2006.01)
(Continued)

(52) U.S. Cl.
CPC ...... *H01L 21/6835* (2013.01); *H01L 25/0753* (2013.01); *H01L 33/58* (2013.01);
(Continued)

(58) Field of Classification Search
CPC .......... H01L 21/6835; H01L 21/67144; H01L 25/0753; H01L 33/58; H01L 33/62; H01L 33/0095
See application file for complete search history.

(56) References Cited

U.S. PATENT DOCUMENTS 6,114,088 A * 9/2000 Wolk ..................... B41M 3/006
503/227
2014/0376165 A1 12/2014 Han et al.
(Continued)

FOREIGN PATENT DOCUMENTS

CA      2941038 A1   3/2018
CA      2986503 A1   5/2019
(Continued)

OTHER PUBLICATIONS

ROC: TW application relating to TW application No. 109120679, dated Jan. 17, 2024.
(Continued)

*Primary Examiner* — Marc Anthony Armand (57) ABSTRACT

Embodiments disclose methods of transferring selected microdevices on a receiver substrate. In one embodiment, a high resolution display comprising a light emitting device (LED) array may be provided to assist in transferring the microdevices. The LED array can selectively either release a layer by using light or cure a bonding layer. The pixels in the display can be turned on corresponding to a set of selected microdevices with predefined intensities to release the set of selected microdevices from the donor substrate.

22 Claims, 13 Drawing Sheets

(51) Int. Cl.
    *H01L 33/58*     (2010.01)
    *H01L 33/62*     (2010.01)

(52) U.S. Cl.
    CPC .... *H01L 33/62* (2013.01); *H01L 2221/68354* (2013.01); *H01L 2221/68368* (2013.01); *H01L 2933/0058* (2013.01); *H01L 2933/0066* (2013.01)

(56) References Cited

U.S. PATENT DOCUMENTS

| | | | |
|---|---|---|---|
| 2016/0219702 A1* | 7/2016 | Chaji | H01L 24/08 |
| 2017/0215280 A1 | 7/2017 | Chaji et al. | |
| 2023/0132210 A1* | 4/2023 | Do | H01L 33/0095 257/88 |

FOREIGN PATENT DOCUMENTS

| | | |
|---|---|---|
| WO | 2016060677 A1 | 4/2016 |
| WO | 2018005118 A1 | 1/2018 |
| WO | 2018096455 A1 | 5/2018 |

OTHER PUBLICATIONS

WIPO: PCT application relating to PCT application No. PCT/CA2020/050840, dated Sep. 11, 2020.

\* cited by examiner

HIGH THROUGHPUT MICROPRINTING PROCESS

FIELD OF THE INVENTION

The present disclosure relates to integrating microdevices into a receiver substrate, and more specifically, the present disclosure relates to structure and methods to assist transfer of selective microdevices from a donor substrate to the receiver substrate.

SUMMARY

One objective of this invention is to provide methods and structures to transfer and bond selective microdevices from a donor substrate to a receiver substrate.

According to one embodiment, a method of transferring selected microdevices on a receiver substrate is provided. A high resolution display comprising a light emitting device (LED) array may be provided to assist in transferring the microdevices. The LED array can selectively either release a layer by using light or cure a bonding layer. A set of selected LEDs in the LED array can be turned on. Thus, releasing or curing can be done selectively. If the release or cured layer are connected to an LED/microdevice, the microdevice will be released or cured to the receiver substrate.

According to another embodiment, there may be provided a housing structure/film coupled to the LED array. A pair of the micro device is connected to the housing through the release layer. A Light guide or light confinement structure can be used to focus the light of each LED/pixel directly to the surface of housing or microdevice, reducing the spread of the light to the neighbouring microdevices. The LED array can be of higher resolution than the microdevices embedded in the housing structure/film. The housing can be a polymer or other material or different layers. The housing can also absorb the Light from the LEDs to further reduces the light leakage to the adjacent/neighbouring microdevices.

According to one embodiment, the microdevices coupled to the LED array is moved to a proximity of the receiver substrate. The receiver substrate can have a bonding or holding layer at the top. The layer can be patterned or a unified layer. The bonding/holding layer can be conductive. After the alignment process, the microdevices and the receiver substrate are moved closer together so that the microdevices are partially (or fully) in contact with the holding/bonding layer. The LED's are selectively turned on. In this case, either the release layer associated with the selected microdevices is released or the bonding/holding layer part associated with the selected microdevices is cured. As such, the selected microdevices will stay on the receiver substrate.

According to another embodiment, a method of transferring selected microdevices to a receiver substrate is provided. The method comprising providing one or more microdevices on a donor substrate, wherein a part of each microdevice is coupled to a housing film through a release layer, providing a holding layer coupled to the receiver substrate, providing a display coupled to the donor substrate, aligning the microdevices to the receiver substrate, moving the microdevices or the receiver substrate to a predefined position, turning cm pixels in the display corresponding to a set of selected microdevices with predefined intensities to release the set of selected microdevices from the donor substrate, holding the set of selected microdevices on the receiver substrate With the holding layer, and separating the receiver substrate and housing film while the set of selected microdevices stay on the receiver substrate.

According to one embodiment, the release layer may include a layer converting light to heat causing ablation and pushing the microdevices out of housing toward the receiver substrate. In one case, the housing film can be the release layer as, veil. In another case, the substrate can be the release layer.

The foregoing and additional aspects and embodiments of the present disclosure will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the disclosure will become apparent upon reading the following detailed description and upon reference to the drawings.

FIG. 2F illustrates a cross-sectional view of activating another set of selective microdevices, in accordance with an embodiment of the present invention.

Use of the same reference numbers in different figures indicate similar or identical elements.

The foregoing and additional aspects and embodiments of the present disclosure will be apparent to those of ordinary skill in the art in view of the detailed description of various embodiments and/or aspects, which are made with reference to the drawings, a brief description of which is provided next.

DETAILED DESCRIPTION

While the present disclosure is susceptible to various modifications and alternative forms, specific embodiments or implementations are shown by way of example in the drawings and will be described in detail herein. It should be understood, however, that the disclosure is not intended to be limited to the particular forms disclosed. Rather, the disclosure covers all modifications, equivalents, and alternatives falling within the spirit of the invention as defined by the appended claims.

As used in the specification and claims, the singular forms "a", "an", and "the" include plural references unless the context clearly dictates otherwise.

In this description, the terms "system substrate", "receiver substrate", and "display substrate" are used interchangeably. However, it is clear to one skilled in the art that the embodiments described herein are independent of substrate type.

In this description, the terms "donor substrate" and "carrier substrate" are used interchangeably. However, it is clear to one skilled in the art that the embodiments described herein are independent of substrate type.

In this description, the terms "temporary substrate", "intermediate substrate", and "cartridge substrate" are used interchangeably. However, it is clear to one skilled in the art that the embodiments described herein are independent of substrate type.

In addition, these embodiments exemplarily illustrate five micro light-emitting devices, but the invention is not limited thereto. The number of micro light-emitting devices may be changed according to actual requirements.

Many microdevices, including light emitting diodes (LEDs), organic LEDs, sensors, solid state devices, integrated circuits, MEMS (micro-electro-mechanical systems) and other electronic components, are typically fabricated in batches, often on planar substrates. To form an operational system, microdevices from at least one donor substrate need to be selectively transferred to a receiver substrate.

Some embodiments of the present disclosure may include an exemplary process to develop microdevices coupled with a housing film on a donor substrate and couple the donor substrate to a display. The display has a higher resolution than the microdevices on the donor substrate.

Figure 1A:
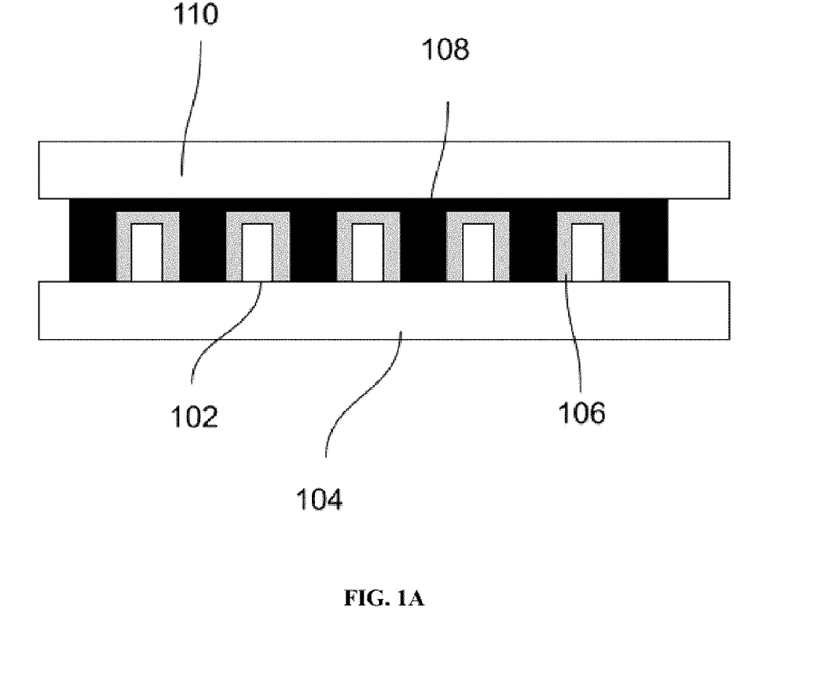
FIG. 1A illustrates a cross-sectional view of a donor substrate having an array of microdevices bonded to a temporary substrate, in accordance with an embodiment of the present invention.

FIG. 1A illustrates a cross-sectional view of a donor substrate having an array of microdevices bonded to a temporary substrate, in accordance with an embodiment of the present invention. Here, one or more microdevices 102 are fully or partially developed on the native (or a temporary) substrate 104. Then, at least a part of the microdevices 102 is covered by a release layer 106. Then, a housing film/structure 108 is formed on or around the microdevices 102. The housing can be a polymer or other material or different layers. The housing can also absorb the light from the LEDs to further reduces the light leakage to the adjacent/neighbouring microdevices. In one case, this process can be done after transferring the microdevices into another temporary substrate 110.

Figure 1B:
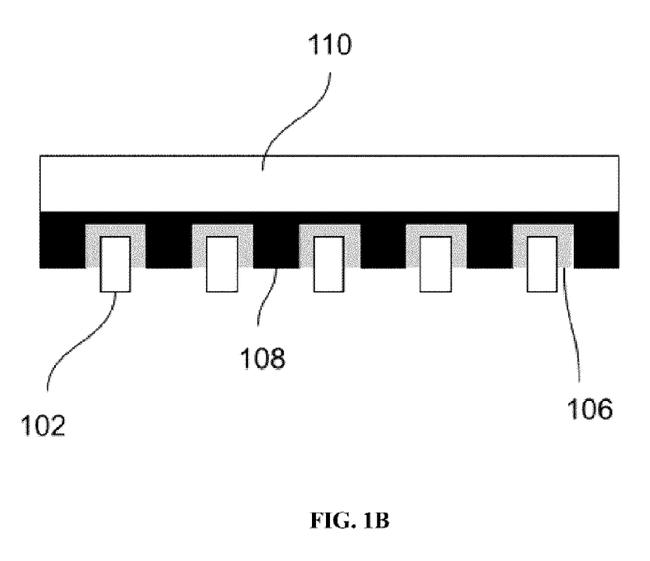
FIG. 1B illustrates a cross-sectional view of removing the donor substrate, in accordance with an embodiment of the present invention.

FIG. 1B illustrates a cross-sectional view of removing the donor substrate, in accordance with an embodiment of the present invention. The housing structure 108 is then bonded to the other temporary substrate 110 to assist with the lift off process. In one case, the microdevices housing film 108 stays on the native substrate despite the lift off process. In another case, the housing film 108 is transferred to the temporary substrate 110. After the lift off other processing steps may be performed such as adding contact layers.

Figure 1C:
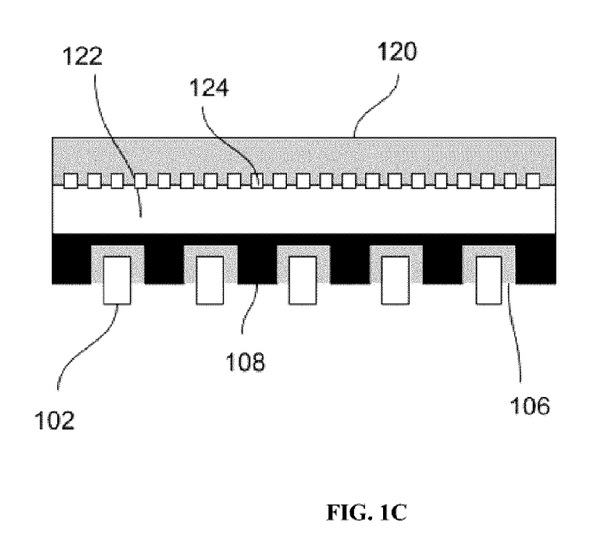
FIG. 1C illustrates a cross-sectional view of aligning the temporary substrate to a display, in accordance with an embodiment of the present invention.

FIG. 1C illustrates a cross-sectional view of aligning the temporary substrate to an LED array, in accordance with an embodiment of the present invention, The microdevices 102 embedded in the housing film 108 can be released from the temporary substrate.

Here, a display 120 can be aligned and coupled with the microdevice housing film 108 either directly or through a light guide structure 122. The light guide or light confinement structure 122 can be used to focus the light of each LED/pixel directly to the surface of housing film or microdevice, reducing the spread of the light to the neighbouring microdevices. In one case, the temporary substrate 110 (as shown in FIG. 1B) can be removed to minimize the distance between the microdevices and the display. In another case, the temporary substrate can be aligned with the display.

The display 120 can be either an LED array 124 or a light modulation device with a back (or front) light source. This description is based on the LED array, however, it can be applied to light modulation devices as well.

In one case, the display 120 can be replaced with an array of heater or mechanical actuators that can be activated selectively. The heat can change the property of release layer 106 and so affect the force between microdevices 102 and the housing film 108. The mechanical actuator can push the microdevices 102 out of the housing film 108 or break down the release layer 106.

In another case, the LED array 124 can be part of a pickup head. Here, the pickup force can be part of the array or at the edge of the LED array 124.

In yet another case, the LED array 124 is coupled with the microdevice housing film 108. Then, the combined structure is picked up by a pickup head. Here, the LED array 124 is bonded to the microdevice film (or cartridge) after alignment, the pickup head pick the combined structure, and the LED array is connected to a controller that decides which LEDs to turn on. The connection can be part of the pickup process and force. The pickup head can use one of: vacuum force, electrostatic force, electromagnetic force, or another type.

In another case, the microdevice film or combined structure fits in a holder or a template that can bring it the receiver substrate, Jn case of using the holder or template for the microdevice film, the display (LED array) can be further array from the microdevice housing film and project into the housing film to selectively release the devices.

FIGS.' 2A-2F illustrate a cross-sectional view of selectively transferring the microdevices into a receiver substrate using an LED array, in accordance with an embodiment of the present invention.

Figure 2A:
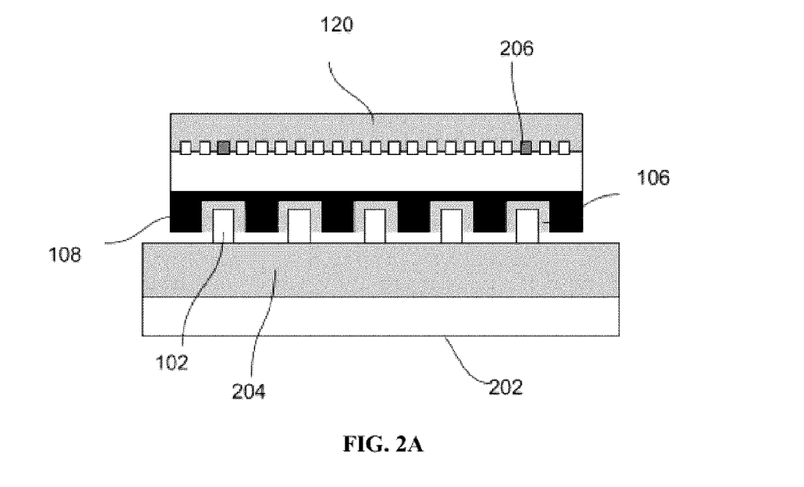
FIG. 2A illustrates a cross-sectional view of selectively transferring the microdevices into a receiver substrate using a display, in accordance with an embodiment of the present invention.

FIG. 2A shows the process of using an LED array to selectively transfer microdevices into a receiver substrate. A receiver substrate 202 with a holding layer 204 is provided. The microdevice housing film 108 gets aligned to the receiver substrate 202, Here, the LED array 120 can be used as part of the alignment process. A set 206 of either different LED lights or the same LED lights at lower intensity is turned on as an alignment mark. The alignment system uses the alignment marks on the receiver substrate 202 and the LED array 206 with microdevice housing film 108 to align the two structures. This process can be repeated once and then calibrated data call be used to move the microdevice housing film to different positions of receiver substrate 202 or the process can be repeated a few times.

After the microdevice housing film 108 is moved into the predefined position, housing film or the receiver substrate 202 are moved toward each other so that the microdevices 102 touches the receiver substrate 202. Here, extra force can be used to press the microdevices against the receiver substrate 202.

Figure 2B:
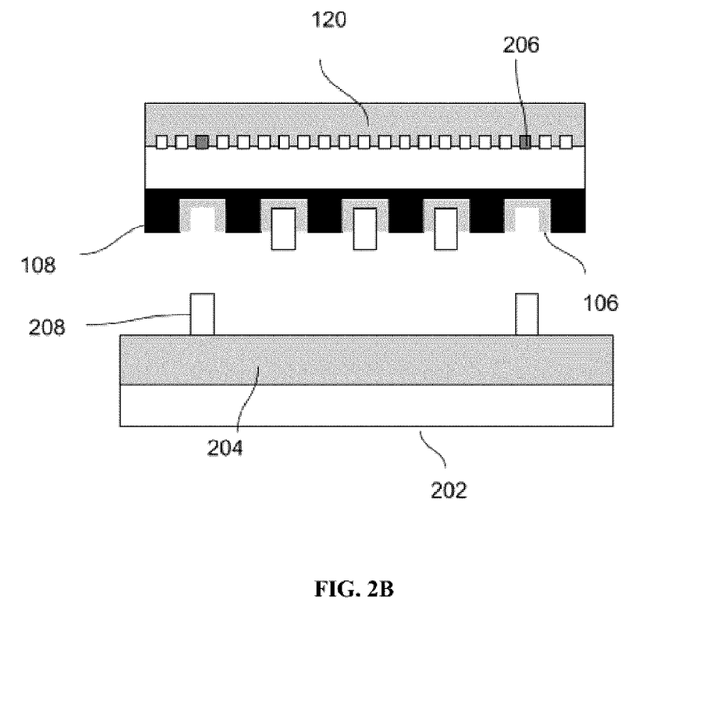
FIG. 2B illustrates a cross-sectional view of activating selected microdevices, in accordance with an embodiment of the present invention.

FIG. 2B illustrates a cross-sectional view of activating selective microdevices, in accordance with an embodiment of the present invention. The LEDs 206 associated with the selected microdevices 208 are turned on at a predefined intensity. The lights (wavelength) can cither release microdevices 208 from the release layer 106 or cure the interface of microdevices 208 with the receiver substrate 202. The receiver substrate 2202 and the microdevice housing film 108 are separated from each other and the selected microdevices 208 stay on the receiver substrate 202, embedded into the holding layer 204.

Figure 2C:
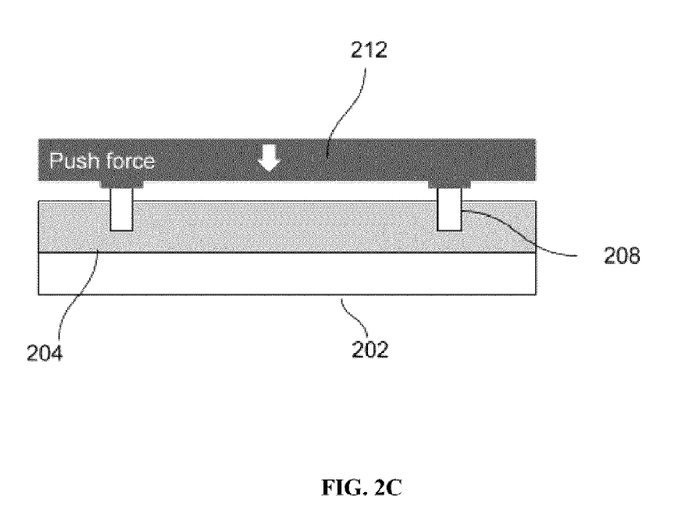
FIG. 2C illustrates a cross-sectional view of using a push force element, in accordance with an embodiment of the present invention.

FIG. 2C illustrates a cross-sectional view of a push force element used to further embed the transferred microdevices into a holding layer 204, in accordance with an embodiment of the present invention. After the microdevices are transferred into the receiver substrate (as shown in FIG. 2B), a push force element 212 can be used to further embed the transferred microdevices 208 into the holding layer 204, The holding layer can be patterned or a unified layer. The bonding/holding layer can be conductive. Here, the holding layer 204 can be thicker or the same height as the microdevices 208. The holding layer 204 can have different layers to accommodate different functionalities. The push force 212 can be created as a result of stronger poll force or a mechanical setup threes the microdevices into the holding layer. Here, the mechanical setup can have a surface profile to enable deeper penetration of microdevices into the holding layer 204.

Figure 2D:
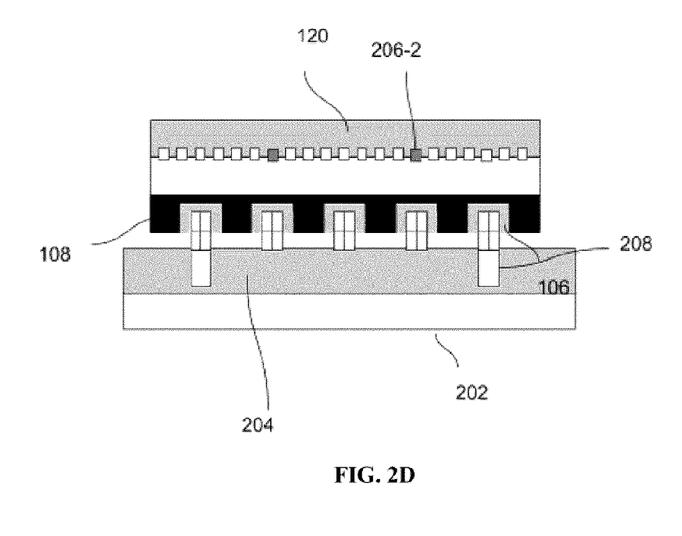
FIG. 2D illustrates a cross-sectional view of transferring another set of selective microdevices into the receiver substrate using a display, in accordance with an embodiment of the present invention.
Figure 2E:
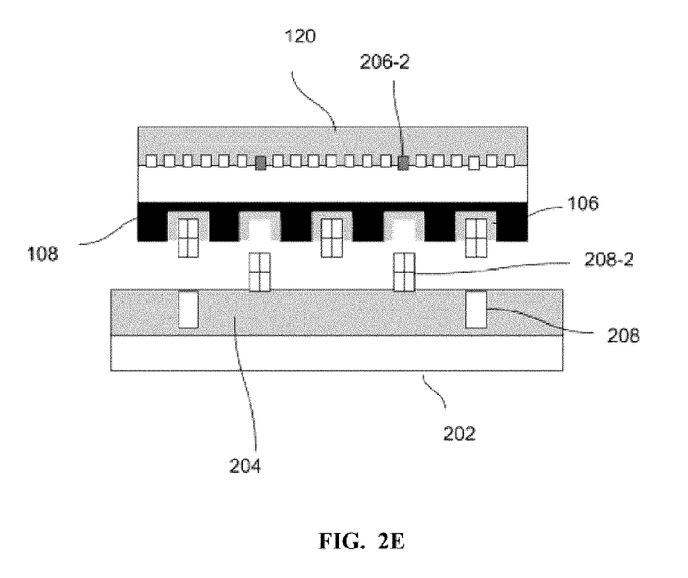
Figure 2F:
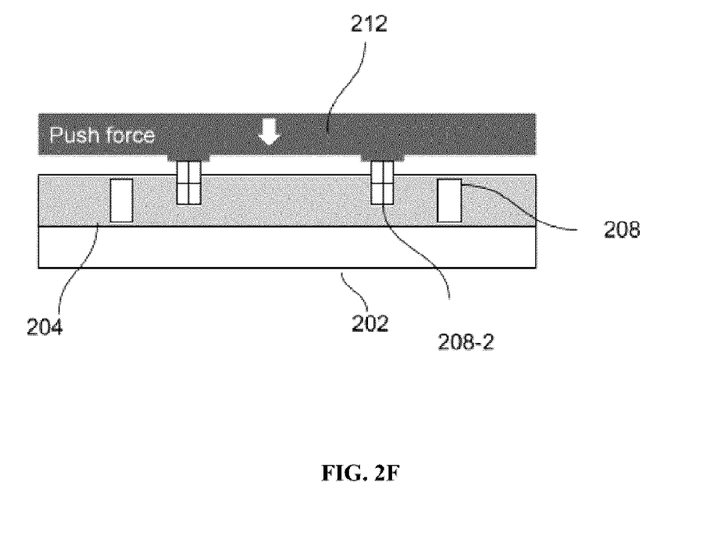
FIG. 2F illustrates a cross-sectional view of using a push force element to further embed the transferred another set of microdevices into a holding layer, in accordance with an embodiment of the present invention.

FIGS.' 2D-2F illustrate a cross-sectional view of transferring another set of selective microdevices into the receiver substrate, in accordance with an embodiment of the present invention. The surface after the first set of microdevices is embedded into the holding layer is almost flat again. This enables the transfer of a second (and more) type of microdevices using different microdevice film. Similar process can be repeated for the second and other types of microdevices.

FIG. 2D illustrates a cross-sectional view of another set activated selected microdevices, in accordance with an embodiment of the present invention. Here the LEDs 206-2 associated with the selected microdevices 208-2 are turned on at a predefined intensity. The lights (wavelength) can either release microdevices 208-2 from the release layer 106 or cure the interface of microdevices 208-2 with the receiver substrate 202.

FIG. 2E shows that the receiver substrate 202 and the microdevice housing film 108 are separated from each other and the selected microdevices 208-2 stay on the receiver substrate 202 embedded into the holding layer 204.

FIG. 2F illustrates a cross-sectional view of a push force element used to further embed the transferred another set of microdevices into a holding layer, in accordance with an embodiment of the present invention. After the microdevices are transferred into the receiver substrate (as shown in FIG. 2E), a push force element 212 can be used to further embed the transferred microdevices 208-2 into the holding layer 204. Here, the holding layer 204 can be thicker or the same height as the microdevices 208-2. The holding layer 204 can have different layers to accommodate different functionalities. The push force 212 can be created as a result of stronger poll force or a mechanical setup forces the microdevices 208-2 into the holding layer. Here, the mechanical setup can have a surface profile to enable deeper penetration of microdevices into the holding layer 204.

Some embodiments of the present disclosure include transferring the microdevices from the housing film into the receiver substrate using global force applied to the receiver substrate. The global force polls the microdevices after the release layer is weakened. The global polling force can be an electromagnetic force or electrostatic force.

Figure 3A:
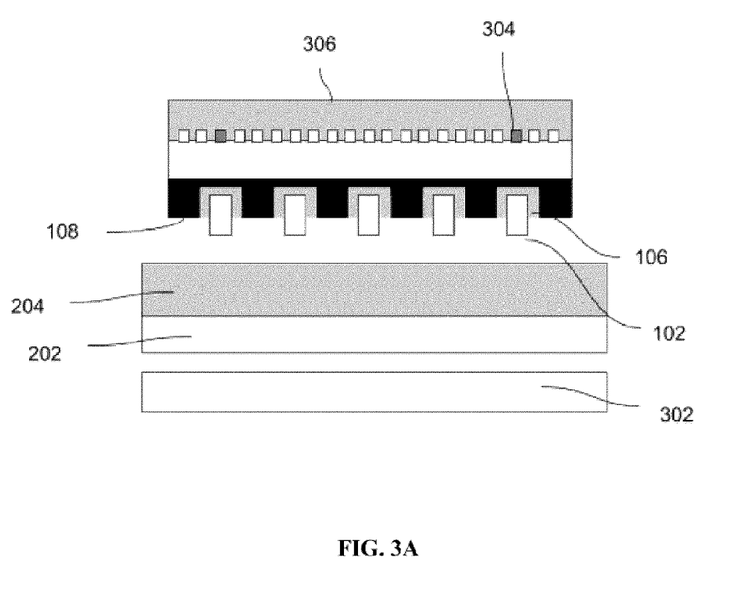
FIG. 3A illustrates another cross-sectional view of transferring the microdevices from the film into the receiver substrate using global force, in accordance with an embodiment of the present invention.
Figure 3B:
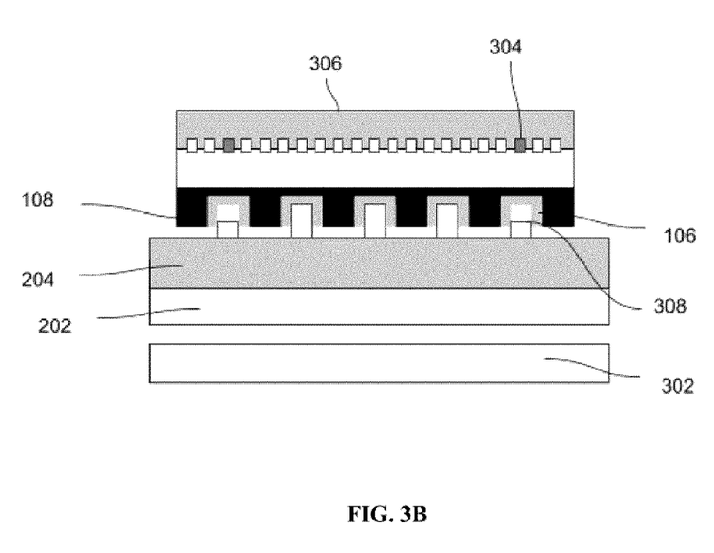
FIG. 3B illustrates a cross-sectional view of transferring the microdevices from the film into the receiver substrate using global force, in accordance with an embodiment of the present invention.
Figure 3C:
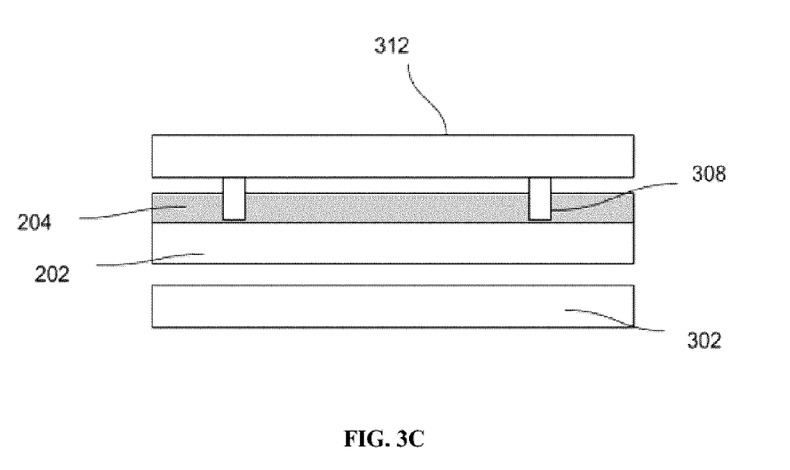
FIG. 3C illustrates a cross-sectional view of using a push force element to further embed the transferred microdevices into a holding layer, in accordance with an embodiment of the present invention.

FIGS.' 3A-3C illustrate another cross-sectional view of transferring the microdevices from the housing film into the receiver substrate using global force, in accordance with an embodiment of the present invention.

Here, a global force 302 is polling the microdevices 102 towards the receiver substrate 202 while the release layer 106 holds the microdevices in place al the housing film 108. By turning on the LEDs 304 in the display 306 that are associated with the selected microdevices 102, the release layer 106 is weakened and the microdevices 102 are polled to the receiver substrate 202.

In one case, the same light, or a different light in the LED array 306 can be used to cure the interface of microdevices with the receiver substrate 202 to permanently hold them in place.

The global polling force 302 can be an electromagnetic or electrostatic force. In case of electromagnetic force, the microdevices have magnetic property. Here, a magnetic force underneath the receiver substrate polls the microdevices toward the receiver substrate. However, the release layer hold them in place. For samples with a weakened release layer, the microdevices move toward the receiver substrate. In case of an electrostatic force, the microdevices are charged or biased and a global electrode underneath the receiver substrate (or on top or as part of the receiver substrate) attracts the microdevices. Here, the microdevices can be biased or charged selectively for further selectivity enforcement. The samples with weakened release layer 106 will move toward the receiver substrate 202.

FIG. 3B illustrates a cross-sectional view of transferring the microdevices from the film into the receiver substrate using global force, in accordance with an embodiment of the present invention.

Here, a receiver substrate 202 with a holding layer 204 is provided. The microdevice housing film 108 gets aligned to the receiver substrate 202. Here, the LED array 306 can be used as part of the alignment process. A set 304 of either different LED lights or the same LED light at a lower intensity is tuned on as an alignment mark. The alignment system uses the alignment marks on the receiver substrate 202 and the LED array 306 with microdevice housing film 108 to align the two structures. This process can be repeated once and then calibrated data can be used to move the microdevice housing film to different positions of receiver substrate 202 or the process can be repeated a few times.

After the microdevice housing film 108 is moved into the predefined position, housing film or the receiver substrate 202 are moved toward each other so that the microdevices touches the receiver substrate 202. The global force 302 is polling the selected microdevices 308 towards the receiver substrate 202 while the release layer 106 hold the microdevices in place at the housing film 108. By taming on the LEDs 304 in the display 306 that are associated with the selected microdevices 308, the release layer 106 is weakened and so the microdevices 308 are polled to the receiver substrate 202.

To avoid tilting or misplacement, the predefined position of the microdevice film housing (donor substrate) in respect to the receiver substrate is chosen so that the microdevices moved to the receiver substrate by polling force are still partially supplied by the housing film. This distance is based on the depth of the housing film and the height of microdevices. After the microdevices are temporarily or folly secured, the donor substrate can move away from the receiver substrate and so the microdevices are fully out of housing film.

FIG. 3C illustrates a cross-sectional view of a push force element used to further embed the transferred microdevices into a holding layer, in accordance with all embodiment of the present invention. After the microdevices are transferred into the receiver substrate (as shown in FIG. 3B), a push force element 312 can be used to further embed the transfer microdevices 308 into the holding layer 204. Here, the holding layer 204 can be thicker or the same height as the microdevices 208. The holding layer 204 can have different layers to accommodate different functionality. The push force 312 can be created as a result of stronger poll force or a mechanical setup forces the microdevices into the holding layer. Here, the mechanical setup can have a surface profile enabling deeper penetration of microdevices into the holding layer 204.

Figure 3D:
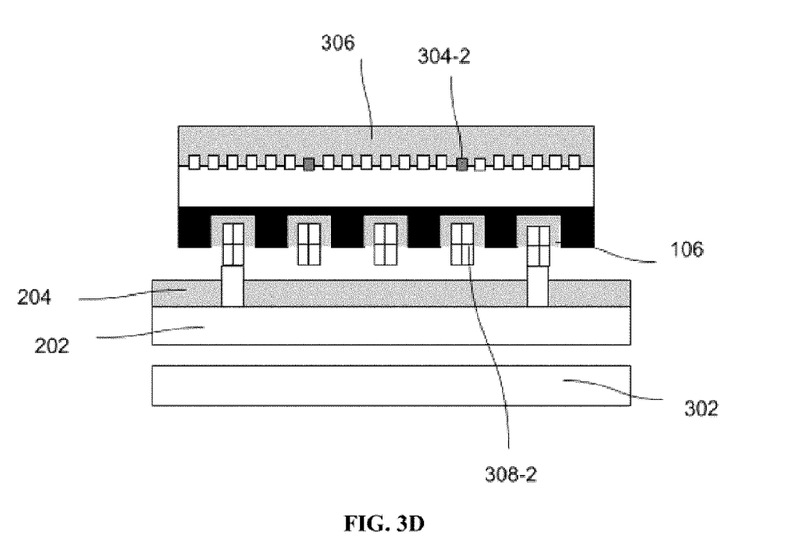
FIG. 3D illustrates a cross-sectional view of transferring another set of selective microdevices into the receiver substrate, in accordance with an embodiment of the present invention.

FIG. 3D illustrates a cross-sectional view of transferring another set of selective microdevices into the receiver substrate, in accordance with an embodiment of the present invention. Here, another set of LEDs 304-2 associated with the selected microdevices 308-2 are turned on al a predefined intensity. By turning on the LEDs 304-2 in the display 306 that are associated with the selected microdevices 308-2, the release layer 106 is weakened and so the microdevices 308-2 are polled to the receiver substrate 202 by using the global force 302.

Figure 3E:
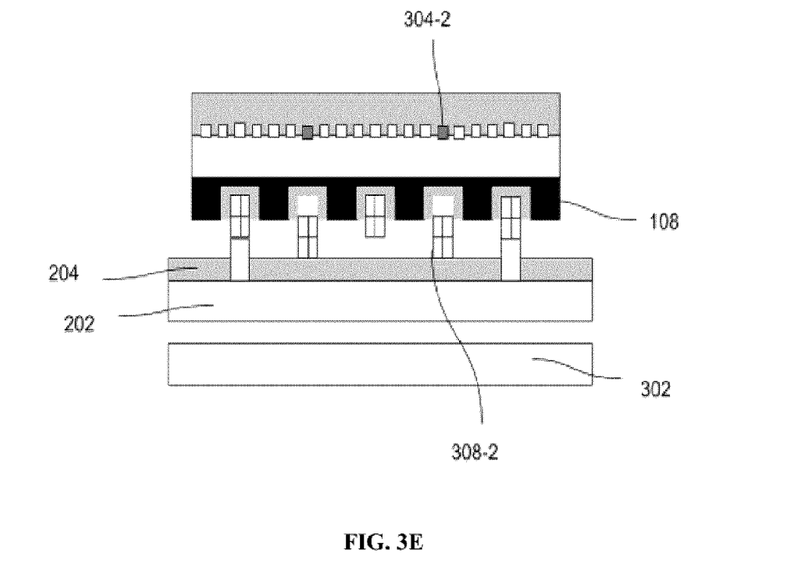
FIG. 3E illustrates a cross-sectional view of activating another set of selective microdevices, in accordance with an embodiment of the present invention.

FIG. 3E shows that the receiver substrate 202 and the microdevice housing film 108 are separated from each other and the selected microdevices 308-2 stay on the receiver substrate 202 embedded into the holding layer 204. The microdevices 308-2 moved to the receiver substrate by globe force 302 are still partially supported by the housing film 108. This di stance is based on the depth of the housing film and the height of microdevices. After the microdevices 308-2 are temporarily or fully secured, the donor substrate can move away from the receiver substrate and so the microdevices are fully out of housing film.

Figure 3F:
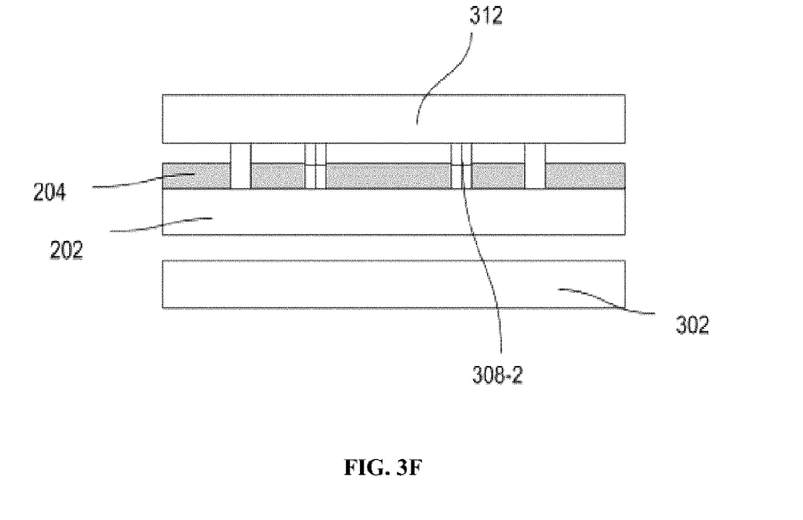
FIG. 3F illustrates a cross-sectional view of using a push force element to further embed the transferred another set of microdevices into a holding layer, in accordance with an embodiment of the present invention.

FIG. 3F illustrates a cross-sectional view of a push force element used to further embed the another set of transferred microdevices into a holding layer, in accordance with an embodiment of the present invention. After the microdevices are transferred into receiver substrate (as shown in FIG. 3E), a push force element 312 can be used to further embed the transferred microdevices 308-2 into the holding layer 204. Here, the holding layer 204 can be thicker or the same height as the microdevices 308-2. The holding layer 204 can have different layers to accommodate different functionalities. The push force 312 can be created as a result of stronger poll force or a mechanical setup forces the microdevices 308-2 into the holding layer. Here, the mechanical setup can have a surface profile enable deeper penetration of microdevices into the holding layer 204.

In the aforementioned embodiments, the release layer may include a layer converting light to heat causing ablation and pushing the microdevices out of housing toward the receiver substrate.

According to another embodiment, a method of transferring selected microdevices to a receiver substrate is provided. The method comprising providing one or more microdevices on a donor substrate, wherein a part of each micro device is coupled to a housing film through a release layer, providing a holding layer coupled to the receiver substrate, providing a display coupled to the donor substrate, aligning the microdevices to the receiver substrate, moving the microdevices or the receiver substrate to a predefined position, turning on pixels in the display corresponding to a set of selected microdevices with predefined intensities to release the set of selected microdevices from the donor substrate, holding the set of selected microdevices cm the receiver substrate with the holding layer, and separating the receiver substrate and housing film while the set of selected microdevices stay on the receiver substrate.

According to some embodiments, the holding layer provides temporary bonding to poll the selected set of microdevices from the donor substrate after the release layer is weakened. The holding layer is cured to provide permanent bonding after micro devices are placed on or inside the holding layer.

According to further embodiments, the method may further comprise providing a push force element to provide deeper penetration of the transferred set of selected microdevices into the holding layer.

According to yet another embodiment, the method may further comprising turning on a second set of pixels in the display corresponding to a second set of selected microdevices with predefined intensities to release the second set of selected microdevices from the donor substrate, holding the second set of selected microdevices on the receiver substrate with the holding layer; and separating the receiver substrate and housing film while the second set of selected microdevices stay on the receiver substrate.

According to one embodiment, the method may further comprise providing a global force to poll the microdevices towards the receiver substrate by weakening the release layer. The global force may comprise one of: an electromagnetic force or an electrostatic force. In case the electrostatic force is applied to the receiver substrate, the microdevices are charged or biased and a global electrode underneath the receiver substrate attracted the microdevices.

According to another embodiment, the step of turning on pixels in the display corresponding to a set of selected microdevices with predefined intensities further comprising curing a part of the holding layer associated with the set of selected microdevices.

According to one embodiment, the holding layer is a single or a patterned layer. The display comprises an array of light emitting diodes or a light modulation device. The display has a high resolution than the donor microdevice array.

According to one embodiment, the method may further comprise providing a light guide or light confinement structure over the display to focus the light of each pixel directly to a surface of the housing film. The housing film comprises a polymer.

According to yet another embodiment, providing a display coupled to the donor substrate comprising aligning the donor substrate to the display directly or through a light guide structure. The display is bonded to the donor substrate after alignment The display has pickup force that can pick up the donor substrate.

According to further embodiments, the donor substrate is placed in a template, wherein the template can hold one or more donor substrates during the transfer process. The display is projected on the donor substrate to weaken the release layer for selected microdevices. The display may comprise an array of heater or mechanical actuators.

In the aforementioned embodiment, the release layer may include a layer converting light to heat causing ablation and pushing the microdevices out of housing toward the receiver substrate.

In one embodiment, the housing film can be the release layer as well. In another embodiment, the substrate can be the release layer.

While the present disclosure is susceptible to various modifications and alternative forms, specific embodiments or implementations have been shown by way of example in the drawings and are described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

I claim:

1. A method of transferring selected microdevices to a receiver substrate, the method comprising:
   providing one or more microdevices on a donor substrate, wherein a part of each micro device is coupled to a housing film through a release layer;
   providing a holding layer coupled to the receiver substrate;
   providing a display coupled to the donor substrate;
   aligning the microdevices to the receiver substrate;
   moving the microdevices or the receiver substrate to a predefined position;
   turning on pixels in the display corresponding to a set of selected microdevices with predefined intensities to release the set of selected microdevices from the donor substrate;
   holding the set of selected microdevices on the holding layer coupled to the receiver substrate; and
   separating the receiver substrate and donor substrate while the set of selected microdevices stay on the receiver substrate.

2. The method of claim 1, wherein the holding layer provides temporary bonding to poll the selected set of microdevices from the donor substrate after the release layer is weakened.

3. The method of claim 1, wherein the holding layer is cured to provide permanent bonding after micro devices are placed on or inside the holding layer.

4. The method of claim 1, further comprising:
   providing a push force element to provide deeper penetration of the transferred set of selected microdevices into the holding layer.

5. The method of claim 1, further comprising:
   turning on a second set of pixels in the display corresponding to a second set of selected microdevices with predefined intensities to release the second set of selected microdevices from the donor substrate;
   holding the second set of selected microdevices on the receiver substrate with the holding layer; and
   separating the receiver substrate and housing film while the second set of selected microdevices stay on the receiver substrate.

6. The method of claim 1, further comprising:
   providing a global force to poll the microdevices towards the receiver substrate by weakening the release layer.

7. The method of claim 1, wherein the global force comprises one of: an electromagnetic force or an electrostatic force.

8. The method of claim 1, wherein the microdevices are charged or biased and a global electrode underneath the receiver substrate attracts the microdevices in case the electrostatic force is applied to the receiver substrate.

9. The method of claim 1, wherein the step of turning on pixels in the display corresponding to a set of selected microdevices with predefined intensities further comprising curing a part of the holding layer associated with the set of selected microdevices.

10. The method of claim 1, wherein the holding layer is a single or a patterned layer.

11. The method of claim 1, wherein the display comprises an array of light emitting diodes or a light modulation device.

12. The method of claim 1, wherein the display has a higher resolution than the microdevices on the donor substrate.

13. The method of claim 1, further comprising:
    providing a light guide or light confinement structure over the display to focus the light of each pixel directly to a surface of the housing film.

14. The method of claim 1, wherein the housing film comprises a polymer.

15. The method of claim 1, wherein providing a display coupled to the donor substrate comprising:
    aligning the donor substrate to the display directly or through the light guide structure.

16. The method of claim 15, wherein the display is bonded to the donor substrate after alignment.

17. The method of claim 1, wherein the display has a pickup force that can pick up the donor substrate.

18. The method of claim 1, wherein the donor substrate is placed in a template, wherein the template can hold one or more donor substrates during the transfer process.

19. The method of claim 15, wherein the display is projected on the donor substrate to weaken the release layer for selected microdevices.

20. The method of claim 15, wherein the display comprises an array of heating or mechanical actuators.

21. The method of claim 1, wherein the housing film is partially supporting the selected microdevices on the receiver substrate.

22. The method of claim 1, wherein the release layer includes a layer converting light to heat causing ablation and pushing the microdevices out of housing toward the receiver substrate.

* * * * *